US009589841B2

(12) United States Patent
Chen et al.

(10) Patent No.: US 9,589,841 B2
(45) Date of Patent: Mar. 7, 2017

(54) ELECTRONIC PACKAGE AND FABRICATION METHOD THEREOF

(71) Applicant: Siliconware Precision Industries Co., Ltd., Taichung (TW)

(72) Inventors: Yan-Heng Chen, Taichung (TW); Yi-Feng Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/981,364

(22) Filed: Dec. 28, 2015

(65) Prior Publication Data

US 2016/0240466 A1 Aug. 18, 2016

(30) Foreign Application Priority Data

Feb. 13, 2015 (TW) ............................ 104104985 A

(51) Int. Cl.

| | |
|---|---|
| ***H01L 23/31*** | (2006.01) |
| ***H01L 23/498*** | (2006.01) |
| ***H01L 21/56*** | (2006.01) |
| ***H01L 21/78*** | (2006.01) |
| ***H01L 21/48*** | (2006.01) |
| *H01L 23/538* | (2006.01) |

(52) U.S. Cl.

CPC .......... *H01L 21/78* (2013.01); *H01L 21/4853* (2013.01); *H01L 21/563* (2013.01); *H01L 21/565* (2013.01); *H01L 23/3114* (2013.01); *H01L 23/3128* (2013.01); *H01L 23/49811* (2013.01); *H01L 21/568* (2013.01); *H01L 23/5389* (2013.01); *H01L 2224/131* (2013.01); *H01L 2224/16227* (2013.01); *H01L 2224/32225* (2013.01); *H01L 2224/73204* (2013.01); *H01L 2224/81005* (2013.01); *H01L 2224/83005* (2013.01); *H01L 2224/92125* (2013.01); *H01L 2924/15311* (2013.01); *H01L 2924/3511* (2013.01)

(58) Field of Classification Search

CPC ............... H01L 23/49838; H01L 21/78; H01L 21/4853; H01L 21/565; H01L 23/3114; H01L 23/49816

USPC .......................................................... 257/738

See application file for complete search history.

(56) References Cited

U.S. PATENT DOCUMENTS

| | | | |
|---|---|---|---|
| 7,642,128 B1 * | 1/2010 | Lin | H01L 21/6835 257/E21.508 |
| 2014/0138791 A1 * | 5/2014 | Chan | H01L 21/561 257/528 |

* cited by examiner

*Primary Examiner* — Caleen Sullivan

(74) *Attorney, Agent, or Firm* — Mintz Levin Cohn Ferris Glovsky and Popeo, P.C.; Peter F. Corless; Steven M. Jensen

(57) ABSTRACT

A method for fabricating an electronic package is provided, including the steps of: providing at least a packaging structure, wherein the packaging structure has a packaging substrate having opposite first and second sides, an electronic element disposed on the first side of the packaging substrate and a plurality of conductors formed on the first side of the packaging substrate; encapsulating the packaging structure with an insulating layer, wherein the insulating layer covers the packaging substrate; and forming an RDL (Redistribution Layer) structure on the insulating layer, wherein the RDL structure is electrically connected to the conductors. Therefore, the area of the insulating layer is not required to correspond to the area of the packaging substrate, thus allowing the area of the packaging substrate to be reduced according to the practical need so as to reduce the width of the electronic package.

16 Claims, 5 Drawing Sheets

2
201
21
251
250
25
27
24
20a
20
20c
20b
26

ELECTRONIC PACKAGE AND FABRICATION METHOD THEREOF

CROSS-REFERENCES TO RELATED APPLICATIONS

This application claims under 35 U.S.C. §119(a) the benefit of Taiwanese Application No. 104104985, filed Feb. 13, 2015, the entire contents of which are incorporated herein by reference.

BACKGROUND OF THE INVENTION

1. Field of the Invention

The present invention relates to packaging technologies, and more particularly, to semiconductor packaging technologies.

2. Description of Related Art

Along with the progress of semiconductor packaging technologies, various package types have been developed for semiconductor devices. To improve electrical performance and save space, a plurality of packages can be stacked to form a package on package (PoP) structure, for example, a fan out package on package (FO PoP) structure, thereby greatly increasing the I/O count and integrating integrated circuits having different functions. Such a packaging method allows merging of heterogeneous technologies in a system-in-package (SiP) so as to systematically integrate a plurality of electronic elements having different functions, such as a memory, a CPU (Central Processing Unit), a GPU (Graphics Processing Unit), an image application processor and so on, and therefore is applicable to various thin type electronic products.

FIG. 1 is a schematic cross-sectional view of a conventional semiconductor package 1 for a PoP structure.

Referring to FIG. 1, the semiconductor package 1 includes a packaging substrate 10 having at least a circuit layer 101 and a semiconductor element 11 flip-chip bonded to the circuit layer 101.

The semiconductor element 11 has an active surface 11*a* with a plurality of electrode pads 110 and an inactive surface 11*b* opposite to the active surface 11*a*. The electrode pads 110 of the semiconductor element 11 are electrically connected to the circuit layer 101 through a plurality of, for example, solder bumps 12. Further, an underfill 13 is formed between the semiconductor element 11 and the circuit layer 101 for encapsulating the solder bumps 12.

Furthermore, an encapsulant 14 is formed on the packaging substrate 10 to encapsulate the underfill 13 and the semiconductor element 11, and a plurality of conductive through holes 17 are formed in the encapsulant 14. One ends of the conductive through holes 17 are exposed from the encapsulant 14 for mounting an electronic device such as an interposer or a packaging substrate (not shown).

However, during formation of the encapsulant 14, since the packaging substrate 10 serves as a carrier, the area of the encapsulant 14 is required to correspond to the area of the packaging substrate 10. As such, the area of the packaging substrate 10 cannot be reduced, thus resulting in a very large width of the semiconductor package 1 and hindering miniaturization of the semiconductor package 1.

Therefore, how to overcome the above-described drawbacks has become critical.

SUMMARY OF THE INVENTION

In view of the above-described drawbacks, the present invention provides an electronic package, which comprises: a packaging substrate having opposite first and second sides; an electronic element disposed on the first side of the packaging substrate; a plurality of conductors formed on the first side of the packaging substrate; an insulating layer encapsulating the packaging substrate, the electronic element and the conductors, wherein the second side of the packaging substrate is exposed from the insulating layer; and an RDL (Redistribution Layer) structure formed on the insulating layer and electrically connected to the conductors.

The present invention further provides a method for fabricating an electronic package, which comprises the steps of: providing at least a packaging structure, wherein the packaging structure has a packaging substrate having opposite first and second sides, an electronic element disposed on the first side of the packaging substrate and a plurality of conductors formed on the first side of the packaging substrate; encapsulating the packaging structure with an insulating layer, wherein the insulating layer covers the packaging substrate; and forming an RDL structure on the insulating layer, wherein the RDL structure is electrically connected to the conductors.

The above-described method can further comprise forming a bonding layer on the RDL structure. A metal frame can be disposed on an edge of the bonding layer. The method can further comprise removing the bonding layer first and then performing a singulation process.

After forming the RDL structure, the above-described method can further comprise performing a singulation process.

In the above-described electronic package and method, each of the conductors can have a ball shape, a post shape or a stud shape.

In the above-described electronic package and method, the conductors can be formed at an outer periphery of the electronic element.

In the above-described electronic package and method, the RDL structure can have at least a dielectric layer and at least a circuit layer formed on the dielectric layer and directly electrically connected to the conductors.

In the above-described electronic package and method, the RDL structure can have at least a dielectric layer, at least a circuit layer formed on the dielectric layer, and a plurality of conductive vias formed in the insulating layer for electrically connecting the circuit layer and the conductors.

In the above-described electronic package and method, the second side of the packaging substrate can be exposed from the insulating layer, allowing a plurality of conductive elements to be formed thereon and electrically connected to the packaging substrate.

According to the present invention, the conductors are formed first and then the packaging structure is encapsulated with the insulating layer in a manner that the insulating layer covers a side surface of the packaging substrate. Further, the invention replaces a conventional electronic device such as an interposer or a packaging substrate with the RDL structure. Compared with the prior art, the area of the insulating layer is not required to correspond to the area of the packaging substrate, thus allowing the area of the packaging substrate to be reduced according to the practical need so as to reduce the width of the electronic package and meet the miniaturization requirement.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2F are schematic cross-sectional views showing a method for fabricating an electronic package 2 according to the present invention.

Figure 1:
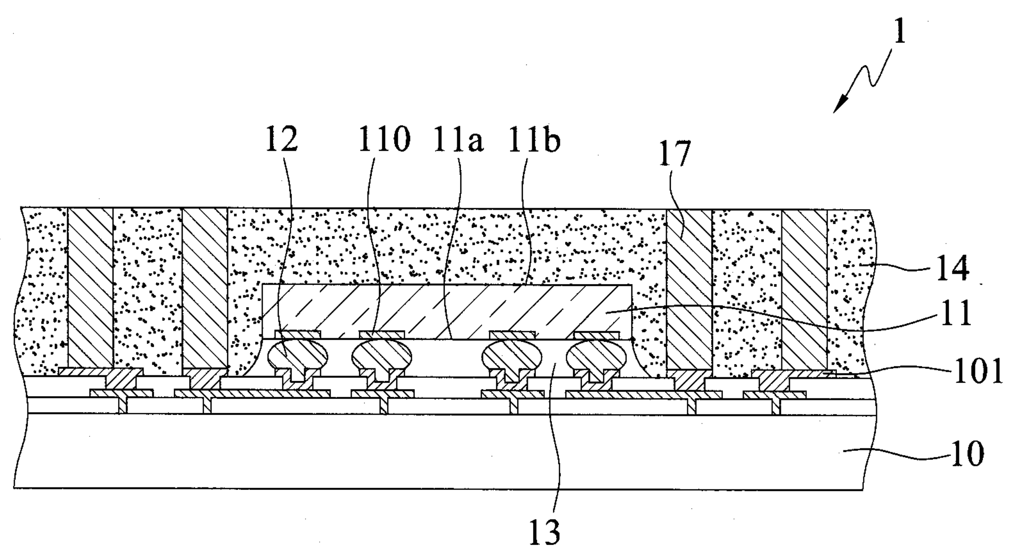
FIG. 1 is a schematic cross-sectional view of a conventional semiconductor package.
Figure 2A:
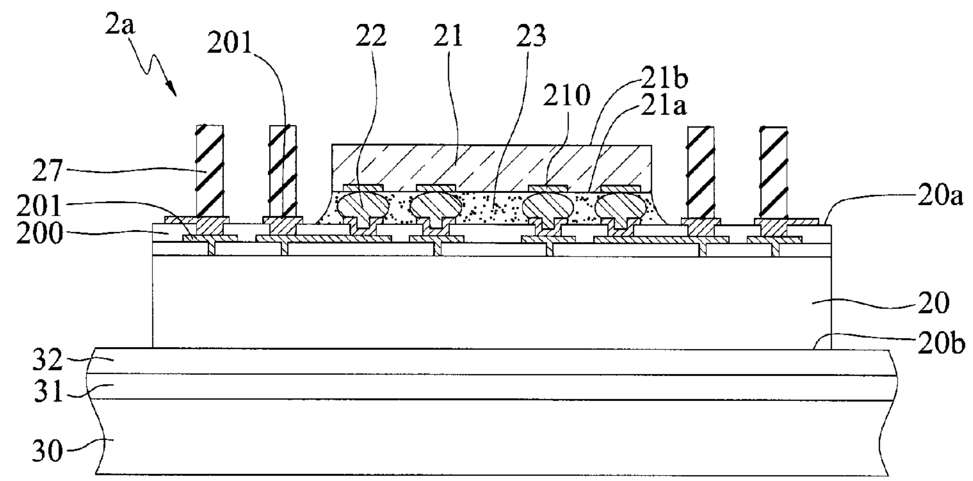
FIGS. 2A and 2F are schematic cross-sectional views showing a method for fabricating an electronic package according to the present invention, wherein FIG. 2C' show another embodiment of FIG. 2C.

Referring to FIG. 2A, at least a packaging structure 2*a* is provided and disposed on a carrier 30. The packaging structure 2*a* has a packaging substrate 20 having a first side 20*a* and a second side 20*b* opposite to the first side 20*a*, an electronic element 21 disposed on the first side 20*a* of the packaging substrate 20, and a plurality of conductors 27 formed on the first side 20*a* of the packaging substrate 20.

In the present embodiment, the packaging substrate 20 has a plurality of dielectric layers 200 and a plurality of circuit layers 201 formed on the dielectric layers 200 and electrically connected to the electronic element 21 and the conductors 27. It should be noted that although only some circuit layers 201 on the first side 20*a* of the packaging substrate 20 are shown in the drawings, the present invention is not limited thereto. For example, a plurality of circuit layers can be formed on the second side 20*b* of the packaging substrate 20 and inside the packaging substrate 20 according to the practical need.

The electronic element 21 is an active element such as a semiconductor chip, a passive element such as a resistor, a capacitor or an inductor, or a combination thereof. For example, the electronic element 21 is a semiconductor chip having an active surface 21*a* with a plurality of electrode pads 210 and an inactive surface 21*b* opposite to the active surface 21*a*. The electronic element 21 is flip-chip disposed on the packaging substrate 20, and the electrode pads 210 of the electronic element 21 are electrically connected to the circuit layers 201 through a plurality of solder bumps 22. Further, an underfill 23 is formed between the electronic element 21 and the circuit layers 201 to encapsulate the solder bumps 22.

Each of the conductors 27 can have a ball shape, a post shape or a stud shape. For example, the conductors 27 can be solder balls, copper posts, solder bumps, or studs formed by a wire bonder.

The carrier 30 is a circular substrate made of glass having a diameter of 12 inch or 300 mm. A release layer 31 and an adhesive layer 32 are sequentially formed on the carrier 30 by coating, and the second side 20*b* of the packaging substrate 20 is attached to the carrier 30 through the adhesive layer 22.

Figure 2B:
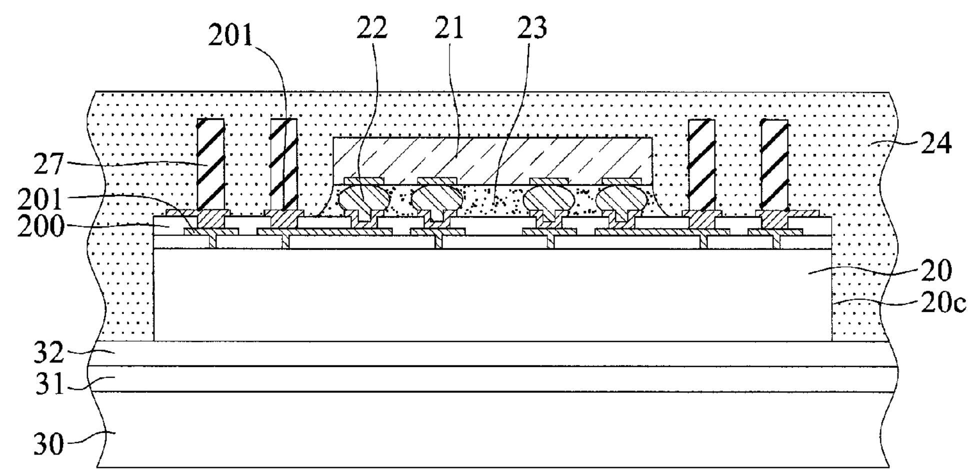

Referring to FIG. 2B, an insulating layer 24 is formed on the carrier 30 to encapsulate the packaging structure 2*a*.

In the present embodiment, the insulating layer 24 covers a side surface 20*c* of the packaging substrate 20 that is adjacent to and connecting the first side 20*a* and the second side 20*b* of the packaging substrate 20.

The insulating layer 24 can be made of an encapsulant such as an epoxy resin and formed by lamination or molding.

Figure 2C:
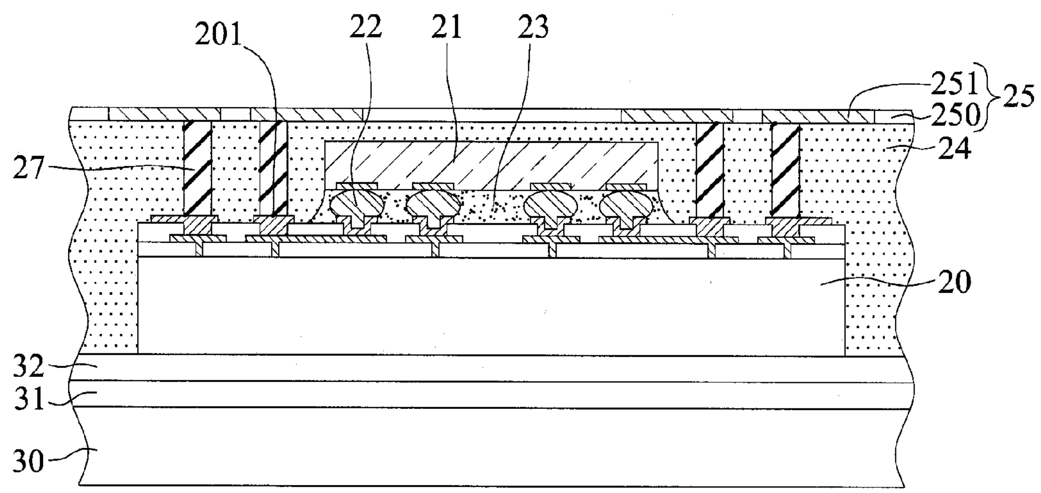
Figure 2C:
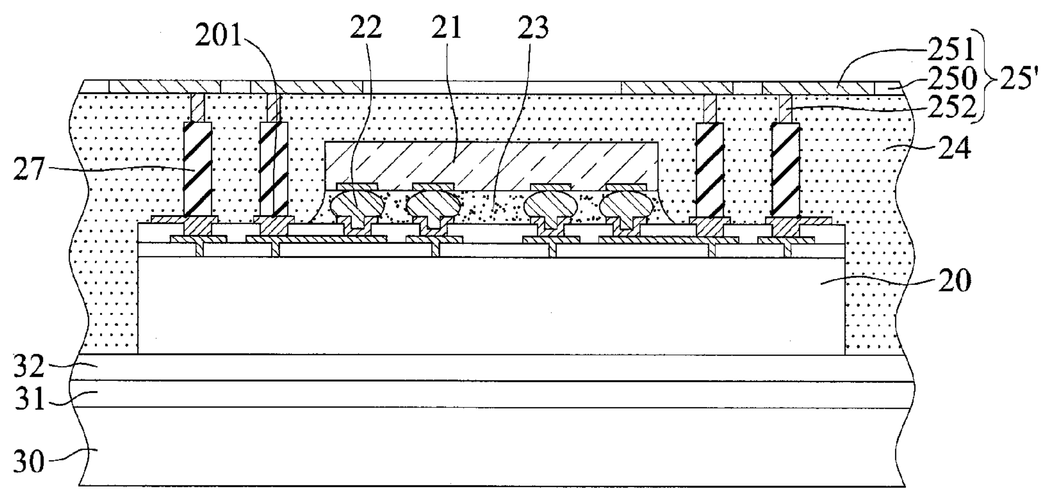

Referring to FIG. 2C, an RDL (Redistribution Layer) structure 25 is formed on the insulating layer 24 and electrically connected to the conductors 27.

In the present embodiment, the RDL structure 25 has at least a dielectric layer 250 and at least a circuit layer 251 formed on the dielectric layer 251 and directly electrically connected to the conductors 27.

In another embodiment, referring to FIG. 2C', the RDL structure 25' further has a plurality of conductive vias 252 are formed in the insulating layer 24 for electrically connecting the circuit layer 251 and the conductors 27.

The circuit layer 251 is made of copper, and the dielectric layer 250 is made of a photoresist material or polybenzoxazole (PBO).

Figure 2D:
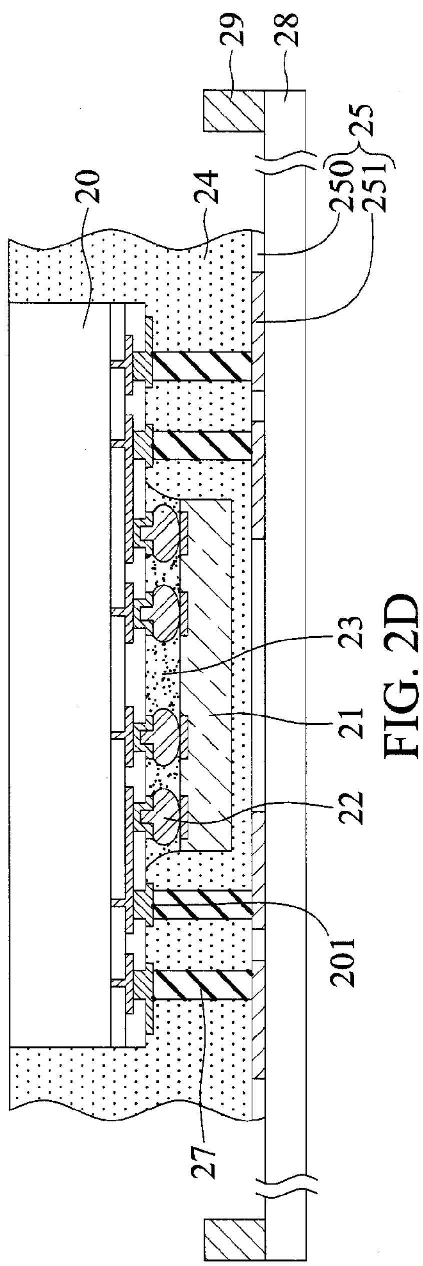

Referring to FIG. 2D, continued from FIG. 2C, a bonding layer 28 such as a tape is formed on the RDL structure 25, and then the carrier 30 and the adhesive layer 32 are removed.

In the present embodiment, ultraviolet or laser light passes through the carrier 30 and irradiates the release layer 31 (made of a photosensitive material) so as to cause removal of the release layer 31, thereby allowing removal of the carrier 30.

Further, a metal frame 29 such as an iron ring is disposed on an edge of the bonding layer 28 to prevent warping of the bonding layer 28.

Figure 2E:
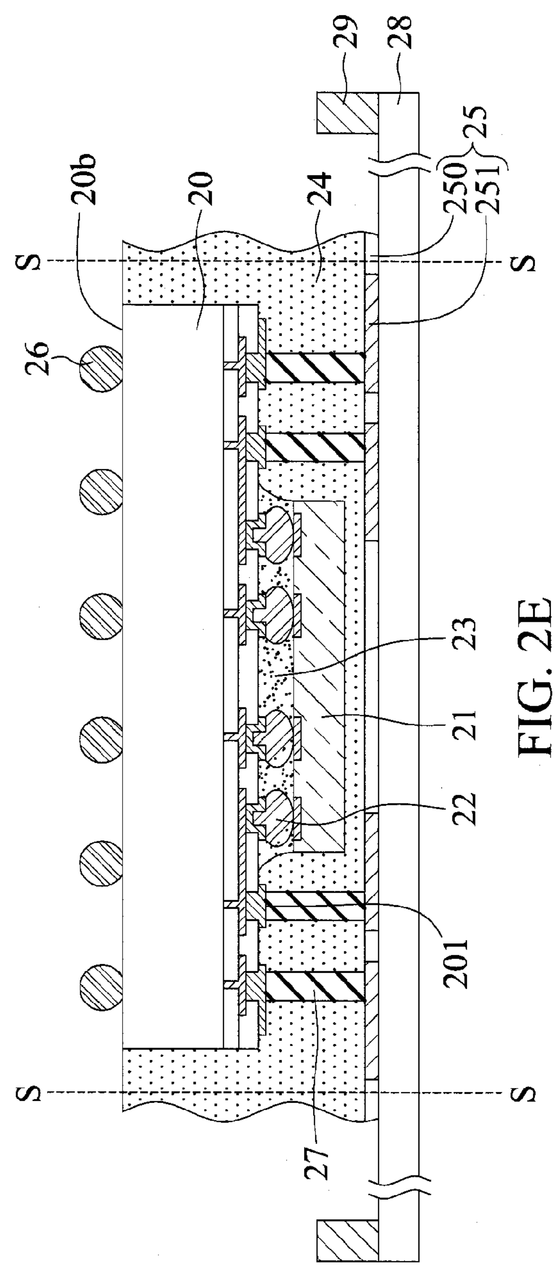

Referring to FIG. 2E, a plurality of conductive elements 26 such as solder balls are formed on the second side 20*b* of the packaging substrate 20 for mounting another package or an electronic device such as a circuit board or an interposer. The conductive elements 26 are electrically connected to the circuit layers 201 of the packaging substrate 20.

Figure 2F:
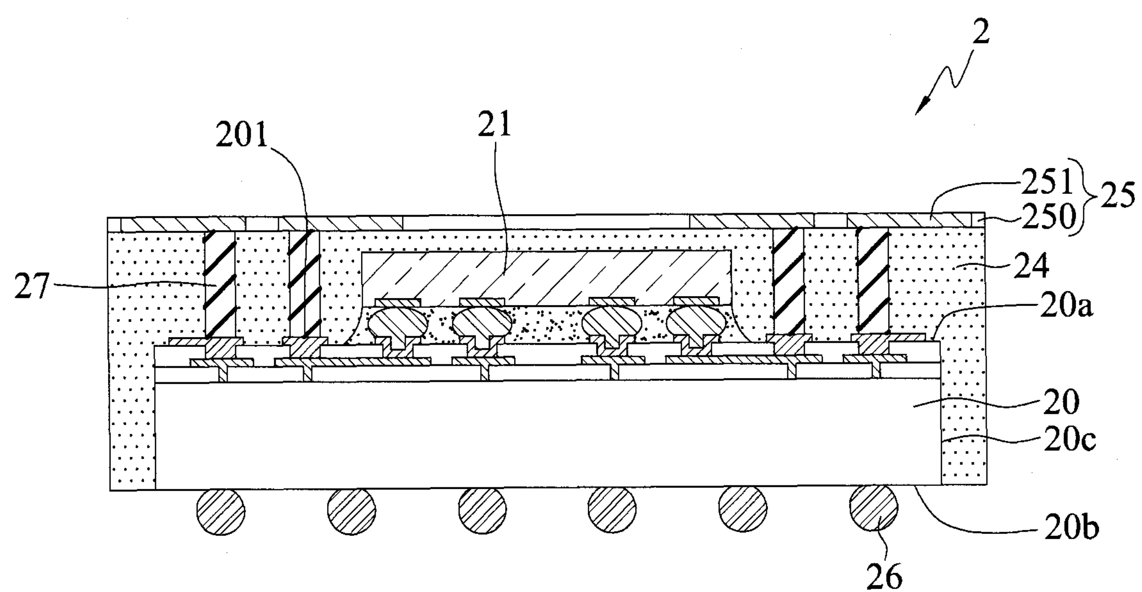

Referring to FIG. 2F, a singulation process is performed along cutting paths S of FIG. 2E, with the metal frame 29 being removed. Further, the bonding layer 28 is removed from the RDL structure 25. As such, an electronic package 2 is obtained.

According to the present invention, the conductors 27 are formed on the packaging substrate 20 first and then the packaging structure 2*a* is encapsulated with the insulating layer 24 in a manner that the insulating layer 24 covers the side surface 20*c* of the packaging substrate 20. As such, the area of the insulating layer 24 is required to correspond to the area of the carrier 30 instead of the packaging substrate 20. Therefore, the area of the packaging substrate 20 can be reduced according to the practical need so as to reduce the width of the electronic package 2 and meet the miniaturization requirement.

Further, by replacing a conventional electronic device such as an interposer or a packaging substrate with the RDL structure 25, 25', the invention allows the packaging substrate 20 to be reduced according to the practical need so as to reduce the width of the electronic package 2 and meet the miniaturization requirement.

The present invention further provides an electronic package 2, which has: a packaging substrate 20 having opposite first and second sides 20*a*, 20*b*; an electronic element 21 disposed on the first side 20*a* of the packaging substrate 20; a plurality of conductors 27 formed on the first side 20*a* of the packaging substrate 20; an insulating layer 24 encapsulating the packaging substrate 20, the electronic element 21 and the conductors 27, wherein the second side 20*b* of the packaging substrate 20 is exposed from the insulating layer 24; and an RDL structure 25, 25' formed on the insulating layer 24 and electrically connected to the conductors 27.

The conductors 27 can be formed at an outer periphery of the electronic element 21. The conductors 27 can be metal posts.

The insulating layer 24 can cover the side surface 20*c* of the packaging substrate 20.

In an embodiment, the RDL structure 25 has at least a dielectric layer 250 and at least a circuit layer 251 formed on the dielectric layer 250 and directly electrically connected to the conductors 27.

In an embodiment, the RDL structure 25' has at least a dielectric layer 250, at least a circuit layer 251 formed on the dielectric layer 250, and a plurality of conductive vias 252 formed in the insulating layer 24 for electrically connecting the circuit layer 251 and the conductors 27.

In an embodiment, the electronic package 2 further has a plurality of conductive elements 26 formed on the second side 20*b* of the packaging substrate 20 and electrically connected to the packaging substrate 20.

Therefore, the present invention forms the conductors first and then encapsulates the packaging structure with the insulating layer so as to allow the insulating layer to cover the side surface of the packaging substrate. Further, the invention replaces the conventional electronic device such as an interposer or a packaging substrate with the RDL structure. As such, the area of the insulating layer is not required to correspond to the area of the packaging substrate, and hence the area of the packaging substrate can be reduced according to the practical need so as to reduce the width of the electronic package and meet the miniaturization requirement.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic package, comprising:
- a packaging substrate having opposite first and second sides;
- an electronic element disposed on the first side of the packaging substrate;
- a plurality of conductors formed on the first side of the packaging substrate;
- an insulating layer encapsulating the packaging substrate, the electronic element and the conductors, wherein the insulating layer covers side surfaces of the packaging substrate and the second side of the packaging substrate is exposed from the insulating layer; and
- an RDL (Redistribution Layer) structure formed on the insulating layer and electrically connected to the conductors.

2. The package of claim 1, wherein each of the conductors has a ball shape, a post shape or a stud shape.

3. The package of claim 1, wherein the conductors are formed at an outer periphery of the electronic element.

4. The package of claim 1, wherein the RDL structure has at least a dielectric layer and at least a circuit layer formed on the dielectric layer and directly electrically connected to the conductors.

5. The package of claim 1, wherein the RDL structure has at least a dielectric layer, at least a circuit layer formed on the dielectric layer, and a plurality of conductive vias formed in the insulating layer for electrically connecting the circuit layer and the conductors.

6. The package of claim 1, further comprising a plurality of conductive elements formed on the second side of the packaging substrate and electrically connected to the packaging substrate.

7. A method for fabricating an electronic package, comprising the steps of:
- providing at least a packaging structure, wherein the packaging structure has a packaging substrate having opposite first and second sides, an electronic element disposed on the first side of the packaging substrate and a plurality of conductors formed on the first side of the packaging substrate;
- encapsulating the packaging structure with an insulating layer, wherein the insulating layer covers side surfaces of the packaging substrate; and
- forming an RDL (Redistribution Layer) structure on the insulating layer, wherein the RDL structure is electrically connected to the conductors.

8. The method of claim 7, wherein each of the conductors has a ball shape, a post shape or a stud shape.

9. The method of claim 7, wherein the conductors are formed at an outer periphery of the electronic element.

10. The method of claim 7, wherein the RDL structure has at least a dielectric layer and at least a circuit layer formed on the dielectric layer and directly electrically connected to the conductors.

11. The method of claim 7, wherein the RDL structure has at least a dielectric layer, at least a circuit layer formed on the dielectric layer, and a plurality of conductive vias formed in the insulating layer for electrically connecting the circuit layer and the conductors.

12. The method of claim 7, wherein the second side of the packaging substrate is exposed from the insulating layer, allowing a plurality of conductive elements to be formed thereon and electrically connected to the packaging substrate.

13. The method of claim 7, further comprising forming a bonding layer on the RDL structure.

14. The method of claim 13, wherein a metal frame is disposed on an edge of the bonding layer.

15. The method of claim 13, further comprising removing the bonding layer first and then performing a singulation process.

16. The method of claim 7, after forming the RDL structure, further comprising performing a singulation process.

* * * * *